(12) United States Patent
Wang et al.

(10) Patent No.: US 10,290,706 B2
(45) Date of Patent: May 14, 2019

(54) THREE-DIMENSIONAL SEMICONDUCTOR WAFER

(71) Applicant: LuoYang HongTai Semiconductor Co., Ltd, Luoyang, Henan (CN)

(72) Inventors: Zhenguo Wang, Henan (CN); Jianwei Deng, Henan (CN); Zhilin Zhang, Henan (CN)

(73) Assignee: LuoYang HongTai Semiconductor Co., Ltd, Luoyang, Henan (CN)

( * ) Notice: Subject to any disclaimer, the term of this patent is extended or adjusted under 35 U.S.C. 154(b) by 0 days.

(21) Appl. No.: 15/665,690

(22) Filed: Aug. 1, 2017

(65) Prior Publication Data

US 2017/0330936 A1    Nov. 16, 2017

(30) Foreign Application Priority Data

Aug. 29, 2016    (CN) .......................... 2016 1 0736822

(51) Int. Cl.
| | |
|---|---|
| *H01L 23/31* | (2006.01) |
| *H01L 23/52* | (2006.01) |
| *H01L 23/485* | (2006.01) |
| *G06T 15/10* | (2011.01) |
| *H01L 29/06* | (2006.01) |
| *H01L 29/786* | (2006.01) |
| *H01L 29/78* | (2006.01) |

(52) U.S. Cl.
CPC .......... *H01L 29/0684* (2013.01); *G06T 15/10* (2013.01); *H01L 23/31* (2013.01); *H01L 23/485* (2013.01); *H01L 23/52* (2013.01); *H01L 29/0634* (2013.01); *H01L 29/78651* (2013.01); *H01L 29/7802* (2013.01)

(58) Field of Classification Search
CPC ...................................................... H01L 23/31
See application file for complete search history.

(56) References Cited

U.S. PATENT DOCUMENTS 6,538,309 B1 *   3/2003   Hotta .................... H01L 21/486
                                                                    257/678

* cited by examiner

*Primary Examiner* — William A Harriston

(57) ABSTRACT

A three-dimensional semiconductor wafer relates to a semiconductor wafer, including a raw semiconductor wafer, at least one connection layer, a conduction layer and a protection layer, wherein the protection layer is arranged on the conduction layer; the connection layer is inserted into a bottom surface or/and a top surface of the raw semiconductor wafer; and the conduction layer is arranged on the bottom surface of the raw semiconductor wafer.

18 Claims, 9 Drawing Sheets

THREE-DIMENSIONAL SEMICONDUCTOR WAFER

CROSS REFERENCE OF RELATED APPLICATION

The application claims priority under 35 U.S.C. 119(a-d) to CN 201610736822.5, filed Aug. 29, 2016.

BACKGROUND OF THE PRESENT INVENTION

Field of Invention

The present invention relates to the field of semiconductor wafers. More particularly, the present invention relates to three-dimensional semiconductor wafers.

Description of Related Arts

Generally, the wafer material applied in the production of semiconductor chips is mainly a single crystal epitaxial wafer or a single crystal polished wafer. The epitaxial wafer is obtained through forming an epitaxial layer on the single crystal polished wafer. The single crystal polished wafer serves as a substrate layer to support the epitaxial layer, and the epitaxial layer is used to support the blocking voltage of power semiconductor devices.

In order to make a breakthrough to the silicon limit and achieve huge improvement for the design of high blocking voltage power devices with reduced specific on-resistance or conduction loss, superjunction (SJ) power devices with a voltage sustaining layer composed of alternating p and n doped region become popular. In order to form a three-dimensional sustaining layer, the methods of multiple epitaxy and deep trench are used. However, these manufacture processes of a SJ sustaining layer are complicated and expensive.

SUMMARY OF THE PRESENT INVENTION

An object of the present invention is to provide a three-dimensional semiconductor wafer.

The three-dimensional semiconductor wafer comprises a raw semiconductor wafer, at least one connection layer, a conduction layer and a protection layer. The protection layer is arranged on the conduction layer. The connection layer is inserted into a bottom surface or/and a top surface of the raw semiconductor wafer. The conduction layer is arranged on the bottom surface of the raw semiconductor wafer.

Preferably, the raw semiconductor wafer is cylindrical.

Preferably, the connection layer comprises a plurality of connection parts. A first end of each connection part is inserted into the raw semiconductor wafer, and a second end of each connection part is level with the bottom surface or the top surface of the raw semiconductor wafer.

Preferably, the connection parts are prismatic, cylindrical, spherical or ellipsoidal, and the connection parts are arranged inside the raw semiconductor wafer in a form of array.

Preferably, the protection layer is arranged on an outer surface of the conduction layer.

Through adopting the above technical solutions, the present invention has following beneficial effects.

The present invention provides the three-dimensional semiconductor wafer, comprising the raw semiconductor wafer, the connection layer, the conduction layer and the protection layer. The three-dimensional semiconductor wafer provided by the present invention can not only replace two-dimensional semiconductor wafer materials such as a single crystal epitaxial wafer, but also provide a design basis for high performance semiconductor devices.

DETAILED DESCRIPTION OF THE PREFERRED EMBODIMENT

Figure 1:
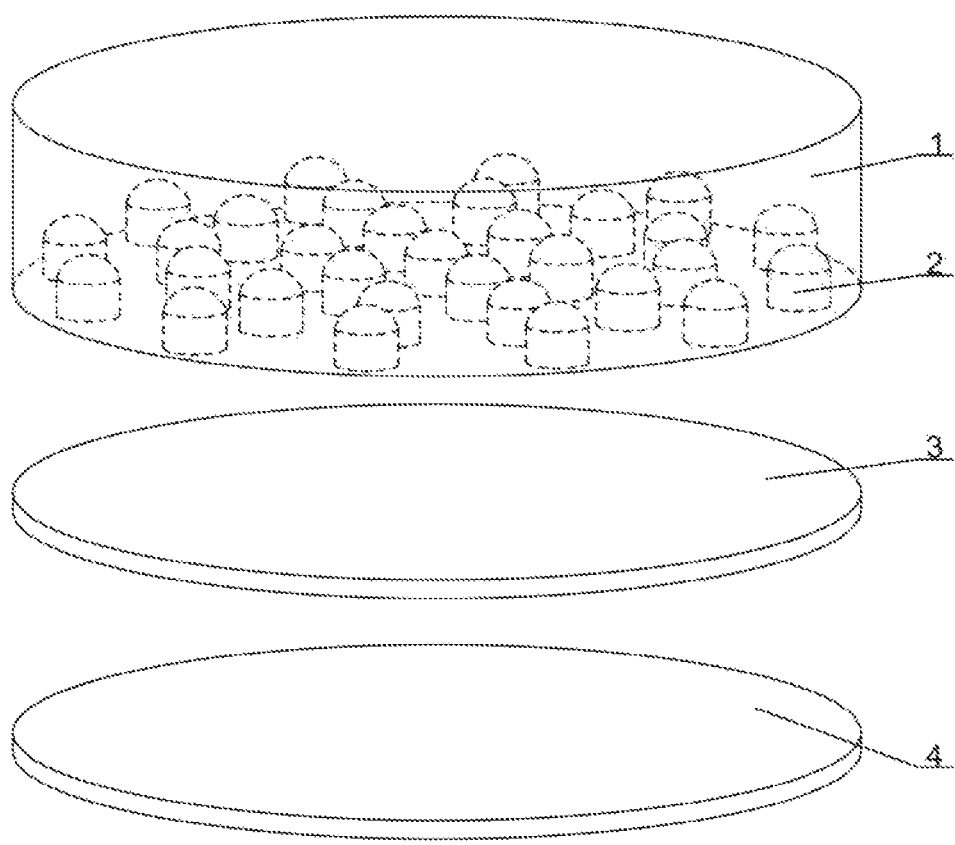
FIG. 1 is an exploded view of a three-dimensional semiconductor wafer according to preferred embodiments of the present invention.

A three-dimensional semiconductor wafer comprises a raw semiconductor wafer 1, at least one connection layer, a conduction layer 3 and a protection layer 4, wherein: the protection layer 4 is arranged on the conduction layer 3; the connection layer is inserted into a bottom surface or/and a top surface of the raw semiconductor wafer 1; the conduction layer is arranged on the bottom surface of the raw semiconductor wafer 1; the raw semiconductor wafer 1 is cylindrical; the connection layer comprises a plurality of connection parts 2; a first end of each connection part 2 is inserted into the raw semiconductor wafer 1, and a second end of each connection part 2 is level with the bottom surface or the top surface of the raw semiconductor wafer 1; the connection parts 2 are prismatic, cylindrical, spherical or ellipsoidal; the connection parts 2 are arranged inside the raw semiconductor wafer 1 in a form of array; and the protection layer 4 is arranged on an outer surface of the conduction layer 3.

For the three-dimensional semiconductor wafer provided by the present invention, according to types of semiconductors of different power, a conduction type of the raw semiconductor wafer 1, the connection layer, and the conduction layer 3 can be respectively selected as N-type or P-type, wherein the bottom surface of the raw semiconductor wafer 1 can be produced according to requirements of a chip.

First Preferred Embodiment

Figure 2:
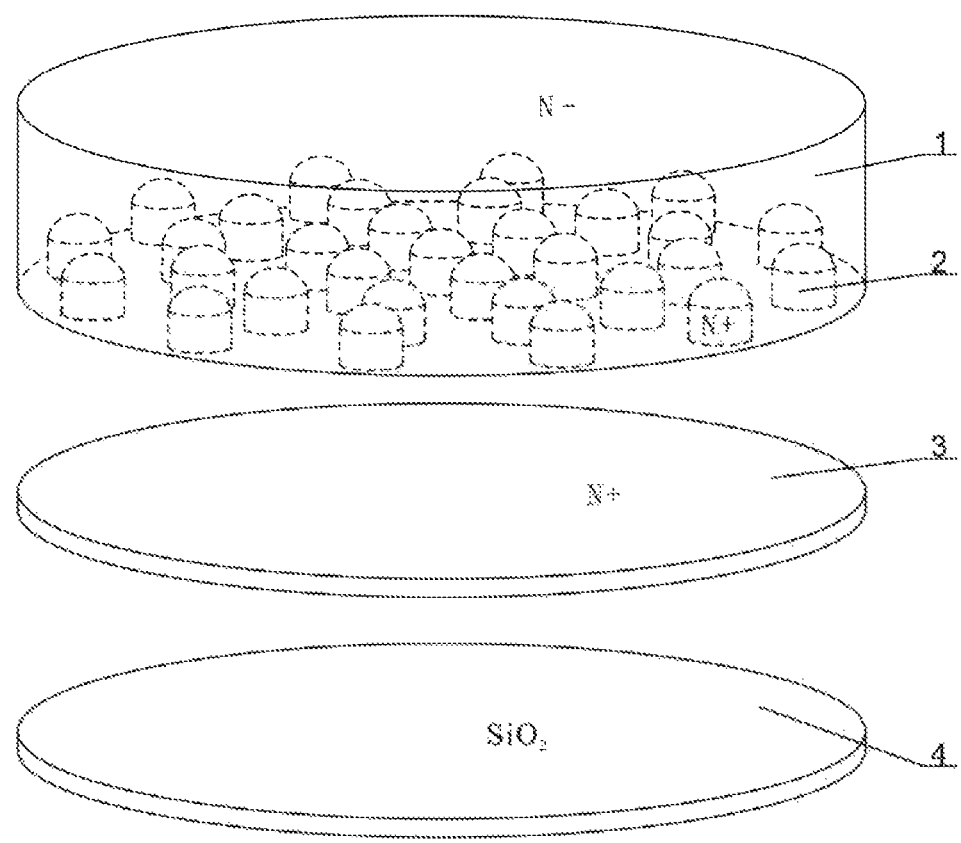
FIG. 2 is an exploded view of an $(N^-/N^+/N^+)$-typed three-dimensional semiconductor wafer according to a first preferred embodiment of the present invention.

As shown in FIG. 2, the raw semiconductor wafer 1 is a lightly doped N-type region, namely an $N^-$ region; the connection layer is a heavily doped N-type region, namely an N⁺ region; for the array-distributed connection parts 2, the first ends are inserted into the raw semiconductor wafer 1, and the second ends are connected to each other on the bottom surface of the raw semiconductor wafer 1 through the conduction layer 3; the conduction layer 3 is a heavily doped N-type region, namely the N⁺ region; and the protection layer 4 is arranged on the conduction layer 3 at the bottom surface of the raw semiconductor wafer 1.

Second Preferred Embodiment

Figure 3:
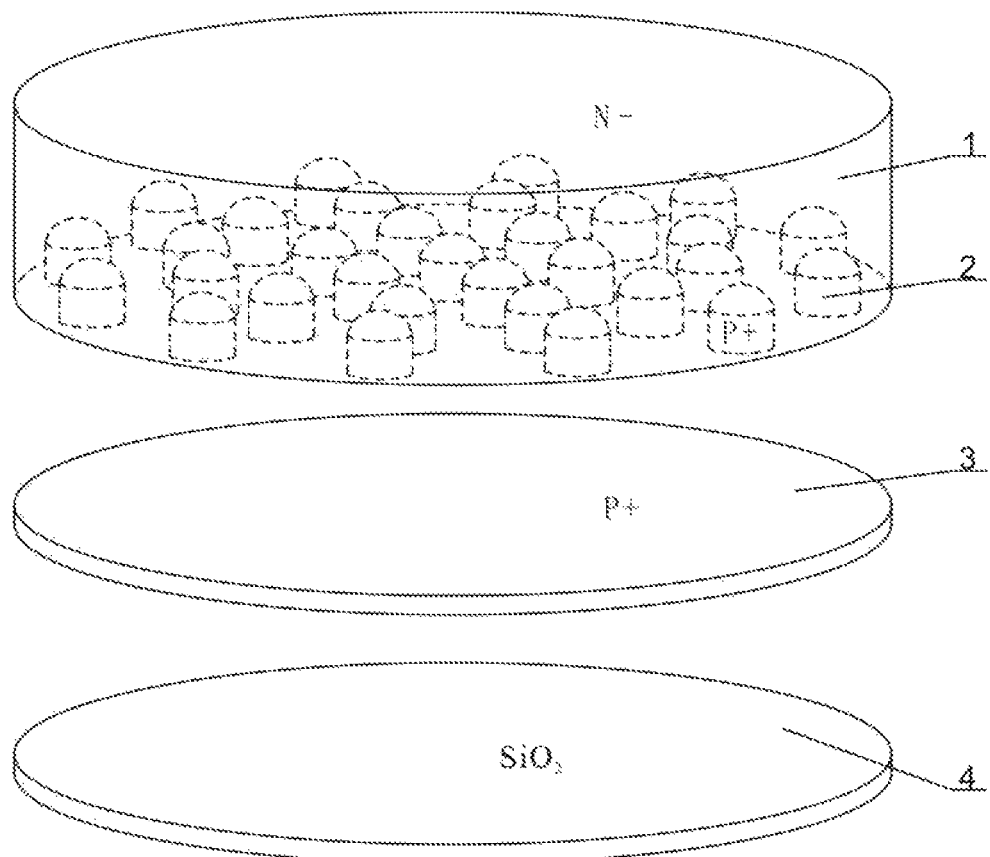
FIG. 3 is an exploded view of an $(N^-/P^+/P^+)$-typed three-dimensional semiconductor wafer according to a second preferred embodiment of the present invention.

As shown in FIG. 3, the raw semiconductor wafer 1 is a lightly doped N-type region, namely an N⁻ region; the connection layer is a heavily doped P-type region, namely a P⁺ region; for the array-distributed connection parts 2, the first ends are inserted into the raw semiconductor wafer 1, and the second ends are connected to each other on the bottom surface of the raw semiconductor wafer 1 through the conduction layer 3; the conduction layer 3 is a heavily doped P-type region, namely the P⁺ region; and the protection layer 4 is arranged on the conduction layer 3 at the bottom surface of the raw semiconductor wafer 1.

Third Preferred Embodiment

Figure 4:
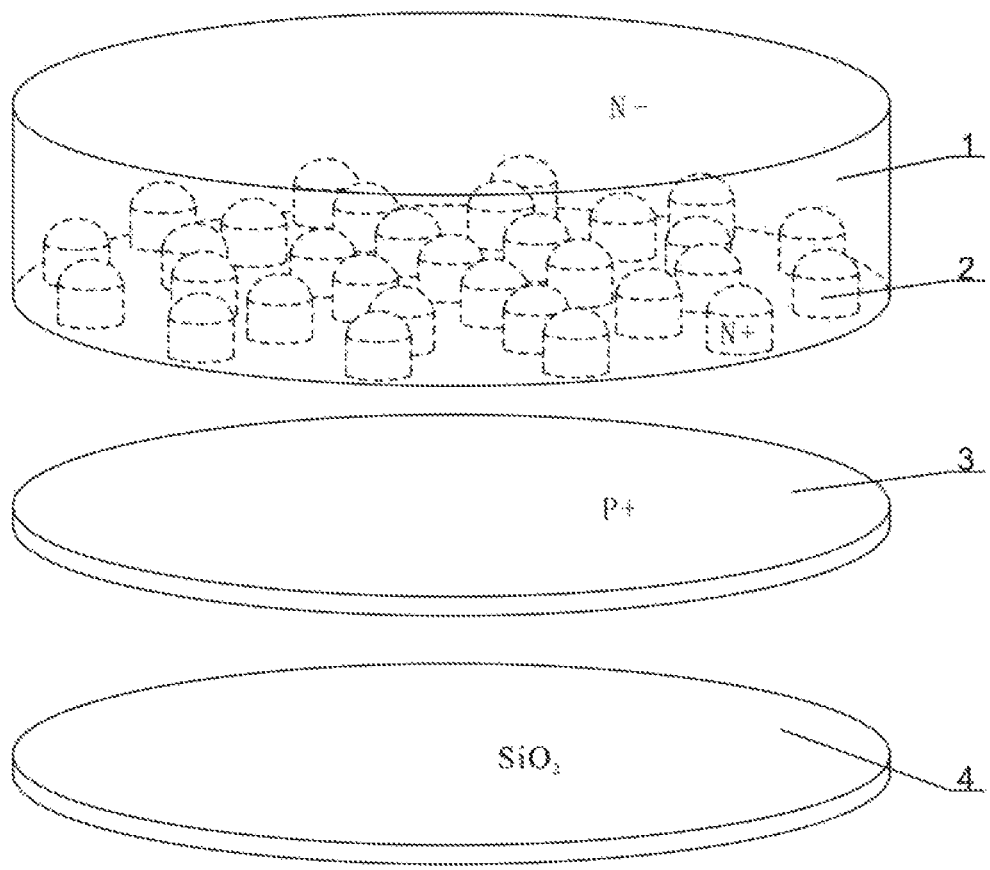
FIG. 4 is an exploded view of an $(N^-/N^+/P^+)$-typed three-dimensional semiconductor wafer according to a third preferred embodiment of the present invention.

As shown in FIG. 4, the raw semiconductor wafer 1 is a lightly doped N-type region, namely an N⁻ region; the connection layer is a heavily doped N-type region, namely an N⁺ region; for the array-distributed connection parts 2, the first ends are inserted into the raw semiconductor wafer 1, and the second ends are connected to each other on the bottom surface of the raw semiconductor wafer 1 through the conduction layer 3; the conduction layer 3 is a heavily doped P-type region, namely a P⁺ region; and the protection layer 4 is arranged on the conduction layer 3 at the bottom surface of the raw semiconductor wafer 1.

Fourth Preferred Embodiment

Figure 5:
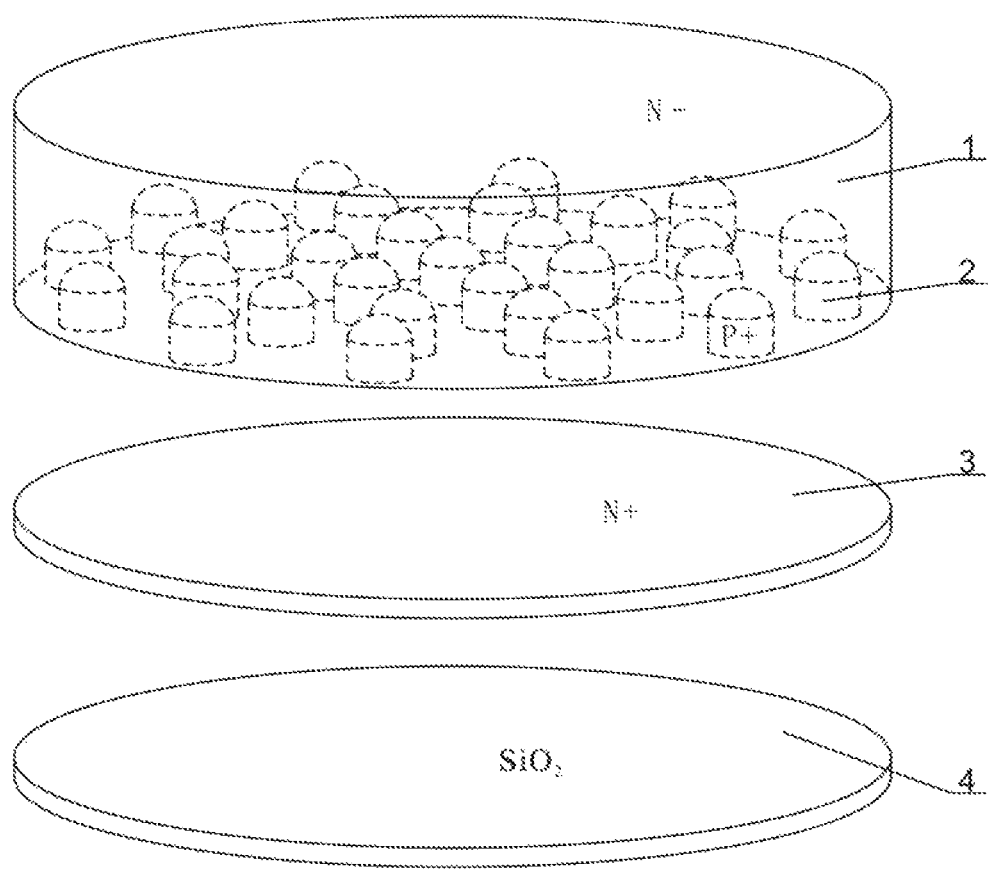
FIG. 5 is an exploded view of an $(N^-/P^+/N^+)$-typed three-dimensional semiconductor wafer according to a fourth preferred embodiment of the present invention.

As shown in FIG. 5, the raw semiconductor wafer 1 is a lightly doped N-type region, namely an N⁻ region; the connection layer is a heavily doped P-type region, namely a P⁺ region; for the array-distributed connection parts 2, the first ends are inserted into the raw semiconductor wafer 1, and the second ends are connected to each other on the bottom surface of the raw semiconductor wafer 1 through the conduction layer 3; the conduction layer 3 is a heavily doped N-type region, namely an N⁺ region; and the protection layer 4 is arranged on the conduction layer 3 at the bottom surface of the raw semiconductor wafer 1. The above three-dimensional semiconductor wafer is mainly applicable in production of N-channel enhancement mode metal-oxide-semiconductor field-effect transistor (MOSFET) and fast recovery diode (FRD) chip.

Fifth Preferred Embodiment

Figure 6:
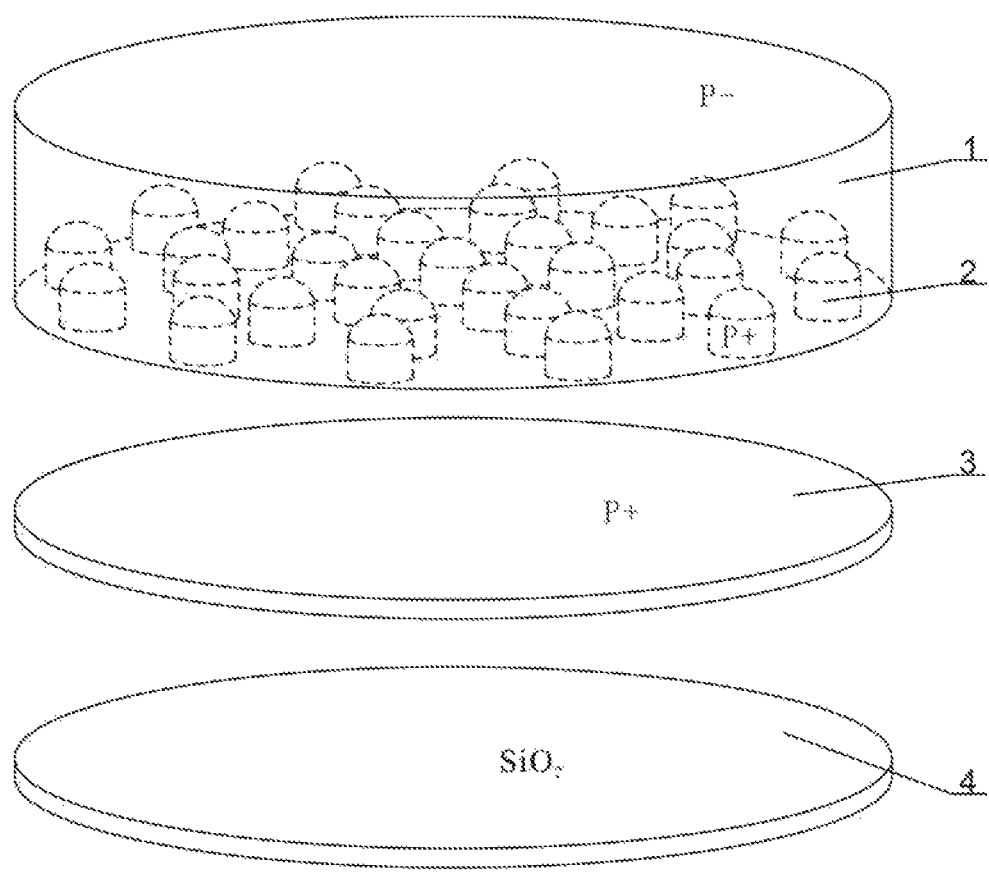
FIG. 6 is an exploded view of a $(P^-/P^+/P^+)$-typed three-dimensional semiconductor wafer according to a fifth preferred embodiment of the present invention.

As shown in FIG. 6, the raw semiconductor wafer 1 is a lightly doped P-type region, namely a P⁻ region; the connection layer is a heavily doped P-type region, namely a P⁺ region; for the array-distributed connection parts 2, the first ends are inserted into the raw semiconductor wafer 1, and the second ends are connected to each other on the bottom surface of the raw semiconductor wafer 1 through the conduction layer 3; the conduction layer 3 is a heavily doped P-type region, namely the P⁺ region; and the protection layer 4 is arranged on the conduction layer 3 at the bottom surface of the raw semiconductor wafer 1. The above three-dimensional semiconductor wafer is mainly applicable in production of P-channel enhancement mode MOSFET and giant transistor (GTR).

Sixth Preferred Embodiment

Figure 7:
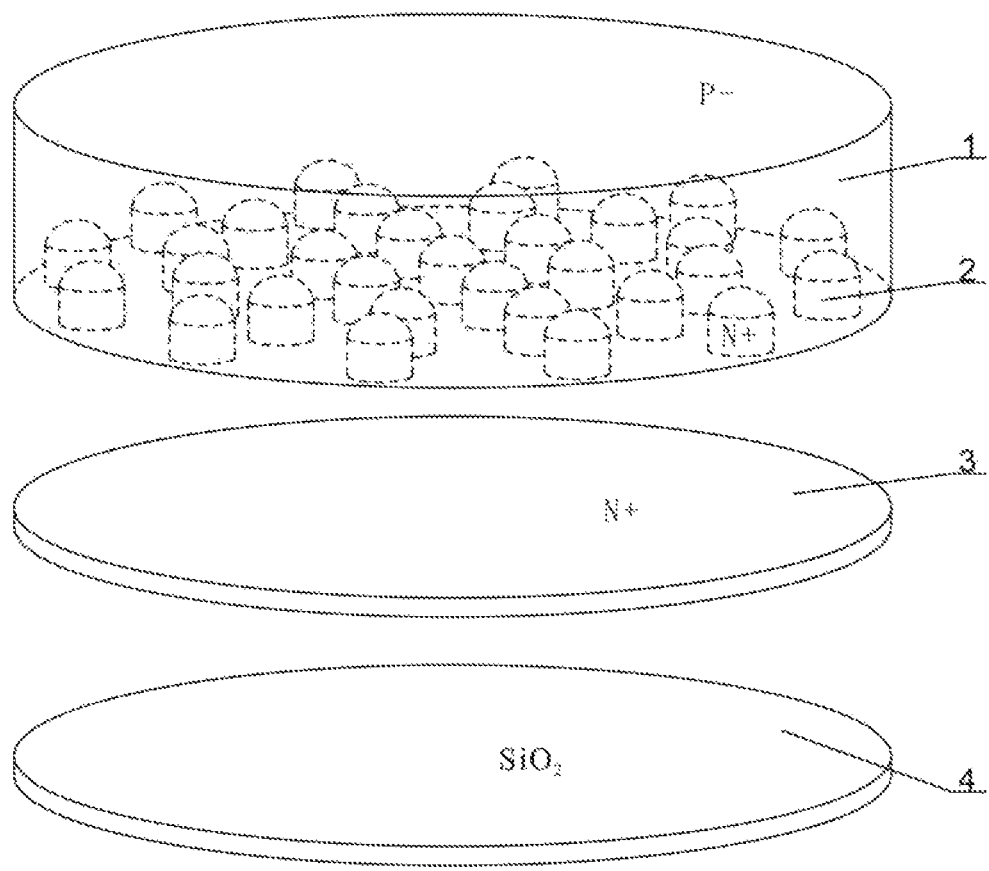
FIG. 7 is an exploded view of a $(P^-/N^+/N^+)$-typed three-dimensional semiconductor wafer according to a sixth preferred embodiment of the present invention.

As shown in FIG. 7, the raw semiconductor wafer 1 is a lightly doped P-type region, namely a P⁻ region; the connection layer is a heavily doped N-type region, namely an N⁺ region; for the array-distributed connection parts 2, the first ends are inserted into the raw semiconductor wafer 1, and the second ends are connected to each other on the bottom surface of the raw semiconductor wafer 1 through the conduction layer 3; the conduction layer 3 is a heavily doped N-type region, namely the N⁺ region; and the protection layer 4 is arranged on the conduction layer 3 at the bottom surface of the raw semiconductor wafer 1.

Seventh Preferred Embodiment

Figure 8:
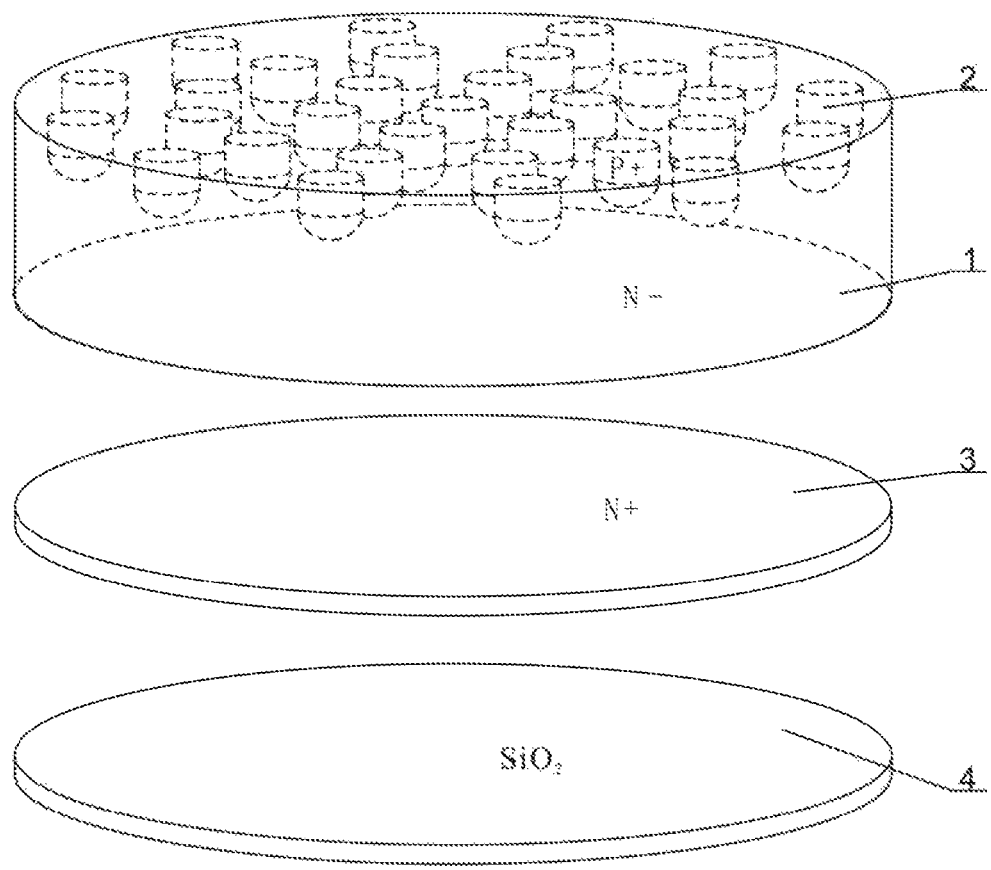
FIG. 8 is an exploded view of an $(N^-/P^+$ top surface$/N^+)$-typed three-dimensional semiconductor wafer according to a seventh preferred embodiment of the present invention.

As shown in FIG. 8, the raw semiconductor wafer 1 is a lightly doped N-type region, namely an N⁻ region; the connection layer is a heavily doped P-type region, namely a P⁺ region; for the array-distributed connection parts 2, the first ends are inserted into the raw semiconductor wafer 1, and the second ends are level with the top surface of the raw semiconductor wafer 1; the conduction layer 3 is a heavily doped N-type region, namely an N⁺ region; and the protection layer 4 is arranged on the conduction layer 3 at the bottom surface of the raw semiconductor wafer 1.

Eighth Preferred Embodiment

Figure 9:
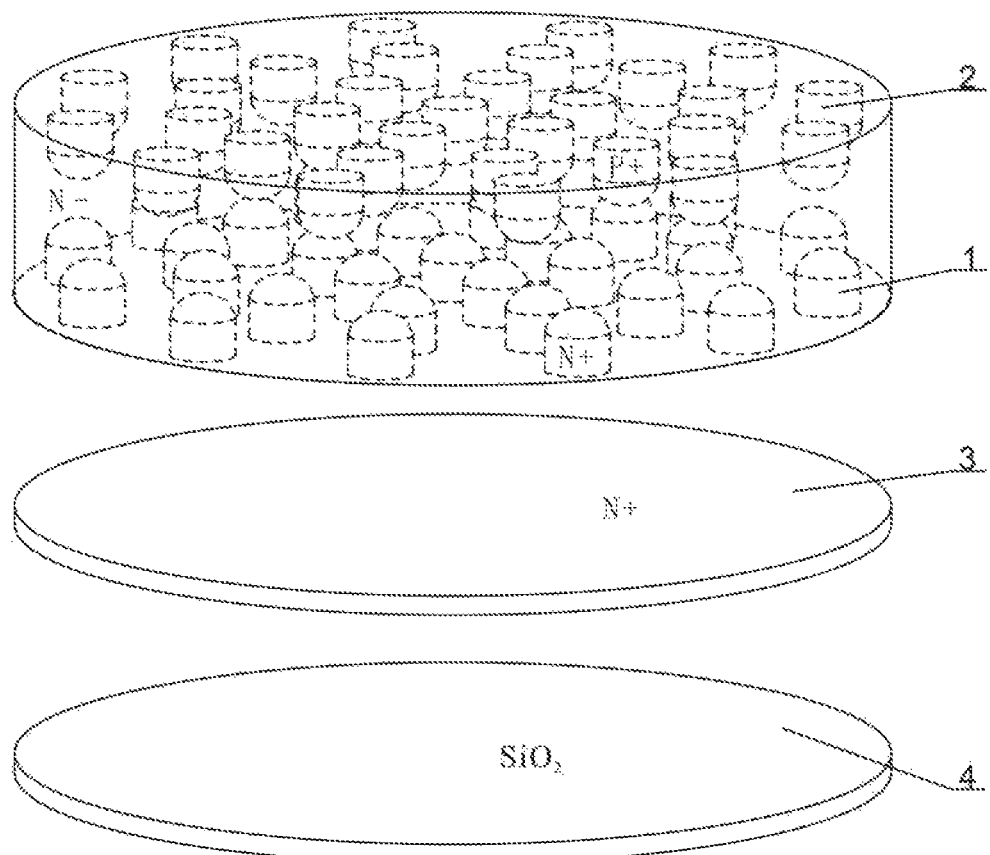
FIG. 9 is an exploded view of an $(N^-/P^+$ top surface$/N^+$ bottom surface$/N^+)$-typed three-dimensional semiconductor wafer according to an eighth preferred embodiment of the present invention.

As shown in FIG. 9, the raw semiconductor wafer 1 is a lightly doped N-type region, namely an N⁻ region; a first connection layer at the top surface of the raw semiconductor wafer is a heavily doped P-type region, namely a P⁺ region, and the array-distributed connection parts 2 of the first connection layer have the first ends inserted into the raw semiconductor wafer 1 and the second ends level with the top surface of the raw semiconductor wafer 1; a second connection layer at the bottom surface of the raw semiconductor wafer 1 is a heavily doped N-type region, namely an N⁺ region, and the array-distributed connection parts 2 of the second connection layer have the first ends inserted into the raw semiconductor wafer 1 and the second ends connected to each other on the bottom surface of the raw semiconductor wafer 1 through the conduction layer 3; the conduction layer 3 is a heavily doped N-type region, namely the N⁺ region; and the protection layer 4 is arranged on the conduction layer 3 at the bottom surface of the raw semiconductor wafer 1.

What is claimed is:
1. A three-dimensional semiconductor wafer, comprising a raw semiconductor wafer, a connection layer, a conduction layer and a protection layer, wherein the raw semiconductor wafer is cylindrical; the protection layer is arranged on the conduction layer; the connection layer is inserted into a bottom surface or/and a top surface of the raw semiconductor wafer; and the conduction layer is arranged on the bottom surface of the raw semiconductor wafer.
2. The three-dimensional semiconductor wafer, as recited in claim 1, wherein an amount of the connection layer is at least one.

3. The three-dimensional semiconductor wafer, as recited in claim 2, wherein the connection layer comprises a plurality of connection parts; a first end of each connection part is inserted into the raw semiconductor wafer, and a second end of each connection part is level with the bottom surface or the top surface of the raw semiconductor wafer; the connection parts are prismatic, cylindrical, spherical or ellipsoidal; and the connection parts are arranged inside the raw semiconductor wafer in a form of array.

4. The three-dimensional semiconductor wafer, as recited in claim 3, wherein the protection layer is connected to the conduction layer and the protection layer is a $SiO_2$ layer.

5. The three-dimensional semiconductor wafer, as recited in claim 2, wherein the protection layer is connected to the conduction layer and the protection layer is a $SiO_2$ layer.

6. The three-dimensional semiconductor wafer, as recited in claim 1, wherein the connection layer comprises a plurality of connection parts; a first end of each connection part is inserted into the raw semiconductor wafer, and a second end of each connection part is level with the bottom surface or the top surface of the raw semiconductor wafer; the connection parts are prismatic, cylindrical, spherical or ellipsoidal; and the connection parts are arranged inside the raw semiconductor wafer in a form of array.

7. The three-dimensional semiconductor wafer, as recited in claim 6, wherein: the raw semiconductor wafer is defined as an N− region, which has a conduction type of N-type; the connection layer is defined as an N+ region, which has the conduction type of N-type; for the array-distributed connection parts, first ends are inserted into the raw semiconductor wafer, and second ends are connected to each other on the bottom surface of the raw semiconductor wafer through the conduction layer; the conduction layer is defined as the N+ region, which has the conduction type of N-type; and the protection layer is arranged on the conduction layer at the bottom surface of the raw semiconductor wafer.

8. The three-dimensional semiconductor wafer, as recited in claim 7, wherein the protection layer is connected to the conduction layer and the protection layer is a $SiO_2$ layer.

9. The three-dimensional semiconductor wafer, as recited in claim 6, wherein: the raw semiconductor wafer is defined as an N− region, which has a conduction type of N-type; the connection layer is defined as a P+ region, which has a conduction type of P-type; for the array-distributed connection parts, first ends are inserted into the raw semiconductor wafer, and second ends are connected to each other on the bottom surface of the raw semiconductor wafer through the conduction layer; the conduction layer is defined as the P+ region, which has the conduction type of P-type; and the protection layer is arranged on the conduction layer at the bottom surface of the raw semiconductor wafer.

10. The three-dimensional semiconductor wafer, as recited in claim 9, wherein the protection layer is connected to the conduction layer and the protection layer is a $SiO_2$ layer.

11. The three-dimensional semiconductor wafer, as recited in claim 6, wherein: the raw semiconductor wafer is defined as an $N^-$ region, which has a conduction type of N-type; the connection layer defined as a $P^+$ region, which has a conduction type of P-type; for the array-distributed connection parts, first ends are inserted into the raw semiconductor wafer, and second ends are connected to each other on the bottom surface of the raw semiconductor wafer through the conduction layer; the conduction layer is defined as an $N^+$ region, which has the conduction type of N-type; and the protection layer is arranged on the conduction layer at the bottom surface of the raw semiconductor wafer.

12. The three-dimensional semiconductor wafer, as recited in claim 11, wherein the protection layer is connected to the conduction layer and the protection layer is a $SiO_2$ layer.

13. The three-dimensional semiconductor wafer, as recited in claim 6, wherein: the raw semiconductor wafer is defined as an $N^-$ region, which has a conduction type of N-type; the connection layer is defined as a $P^+$ region, which has a conduction type of P-type; for the array-distributed connection parts, first ends are inserted into the raw semiconductor wafer, and second ends are level with the top surface of the raw semiconductor wafer; the conduction layer is defined as an $N^+$ region, which has the conduction type of N-type; and the protection layer is arranged on the conduction layer at the bottom surface of the raw semiconductor wafer.

14. The three-dimensional semiconductor wafer, as recited in claim 13, wherein the protection layer is connected to the conduction layer and the protection layer is a $SiO_2$ layer.

15. The three-dimensional semiconductor wafer, as recited in claim 6, wherein the protection layer is connected to the conduction layer and the protection layer is a $SiO_2$ layer.

16. The three-dimensional semiconductor wafer, as recited in claim 1, wherein the protection layer is arranged on an outer surface of the conduction layer.

17. The three-dimensional semiconductor wafer, as recited in claim 16, wherein the protection layer is connected to the conduction layer and the protection layer is a $SiO_2$ layer.

18. The three-dimensional semiconductor wafer, as recited in claim 1, wherein the protection layer is connected to the conduction layer and the protection layer is a $SiO_2$ layer.

* * * * *